United States Patent [19]

Jarvinen et al.

[11] Patent Number: 5,526,366
[45] Date of Patent: Jun. 11, 1996

[54] SPEECH CODE PROCESSING

[75] Inventors: Kari Jarvinen; Janne Vainio, both of Tampere, Finland

[73] Assignee: Nokia Mobile Phones Ltd., Salo, Finland

[21] Appl. No.: 375,550

[22] Filed: Jan. 19, 1995

[30] Foreign Application Priority Data

Jan. 24, 1994 [FI] Finland ................................ 940331

[51] Int. Cl.$^6$ ................................................ G06F 11/00
[52] U.S. Cl. ................................................ 371/31; 371/30
[58] Field of Search ........................... 371/31, 30, 15.1, 371/48, 7, 8.2, 18, 11.2, 20.1; 370/13, 14, 15, 16, 17; 381/46, 31; 379/2

[56] References Cited

U.S. PATENT DOCUMENTS

| | | | |
|---|---|---|---|
| 4,831,624 | 5/1989 | McLaughlin et al. | 371/37 |
| 5,073,940 | 12/1991 | Zinser et al. | 381/47 |
| 5,097,507 | 3/1992 | Zinser et al. | 381/31 |
| 5,224,167 | 6/1993 | Taniguchi et al. | 381/36 |
| 5,325,374 | 6/1994 | Hoshi et al. | 371/43 |
| 5,420,872 | 5/1995 | Hyodo et al. | 371/31 |
| 5,432,884 | 7/1995 | Kapanen et al. | 395/2.37 |

FOREIGN PATENT DOCUMENTS

| | | |
|---|---|---|
| 0195487 | 9/1986 | European Pat. Off. . |
| 0379296A2 | 7/1990 | European Pat. Off. . |
| WO89/02148 | 3/1989 | WIPO . |
| WO92/16065 | 9/1992 | WIPO . |

OTHER PUBLICATIONS

"Frame Substitution and Adaptive Post–Filtering in Speech Coding", D. Sereno, Eurospeech–1991, pp. 595–598.

Finnish Office Action on Finnish Priority Application No. 940331 and English translation dated 31 Oct. 1994.

*Primary Examiner*—Robert W. Beausoliel, Jr.
*Assistant Examiner*—Phung M. Chung
*Attorney, Agent, or Firm*—Perman & Green

[57] ABSTRACT

The invention relates to a method for processing the parameters of a speech coder according to the quality of the transmission connection. The quality of the transmission connection is determined in a quality monitoring member (409) on the basis of erroneous/error-free classifications of single received frames so that for determining the quality of the transmission connection the classifications of single frames performed during several subsequent speech frames are scanned. On the basis of the quality of the transmission connection both the replacement procedure of erroneous speech frames carried out in the replacement member (402) and the processing of the frames detected as error-free carried out in the processing member (406) of error-free frames are controlled so that the effect of the transmission errors on the quality of the decoded speech signal remains insignificant (FIG. 4).

17 Claims, 5 Drawing Sheets

| FRAME NO. | FRAME CLASSIFICATION | PROCESSING STATE ACC. TO INVENTION | PROCESSING STATE IN PRIOR KNOWN METHOD |
|---|---|---|---|
| 1 | g | 0 | 0 |
| 2 | g | 0 | 0 |
| 3 | g | 0 | 0 |
| 4 | g | 0 | 0 |
| 5 | B | D1 | 1 |
| 6 | g | 0 | 0 |
| 7 | g | 0 | 0 |
| 8 | B | D1 | 1 |
| 9 | g | 0 | 0 |
| 10 | B | D1 | 1 |
| 11 | B | D2 | 2 |
| 12 | g | U1 | 0 |
| 13 | B | D2 | 1 |
| 14 | g | U1 | 0 |
| 15 | g | 0 | 0 |
| 16 | B | D1 | 1 |
| 17 | B | D2 | 2 |
| 18 | B | D3 | 3 |
| 19 | B | D4 | 4 |
| 20 | B | D5 | 5 |
| 21 | B | D6 | 6 |
| 22 | g | U5 | 0 |
| 23 | g | U4 | 0 |
| 24 | B | D5 | 1 |
| 25 | B | D6 | 2 |
| 26 | B | D6 | 3 |
| 27 | B | D6 | 4 |
| 28 | B | D6 | 5 |
| 29 | B | D6 | 6 |
| 30 | g | U5 | 0 |
| 31 | B | D6 | 1 |
| 32 | B | D6 | 2 |
| 33 | B | D6 | 3 |
| 34 | B | D6 | 4 |
| 35 | B | D6 | 5 |

FIG. 6

SPEECH CODE PROCESSING

FIELD OF THE INVENTION

This invention relates to speech code processing, in particular processing speech code parameters in the receiver of a communication system.

BACKGROUND OF THE INVENTION

It is known for transmission errors to occur in the transmission path of a communications system and which act to impair the quality of the decoded speech signal in the receiver. Generally, attempts are made to avoid such transmission errors and in particular to protect speech coding parameters from such errors. For this purpose error correction coding is usually carried out in the channel coding for the transmitter, in connection with the channel coding, for the most important parameters to be sent. By means of the error correction coding the transmission errors which have been generated in the transmission path and have affected the error correction coded parameters can be detected and possibly corrected in the channel decoding carried out in the receiver. This kind of a method has been described in the article Eurospeech-91, D. Serene, "Frame substitution and adaptive post-filtering in speech coding", p. 595–598. Of transmission errors that cannot be corrected by the channel decoder have been formed in the transmission path the channel decoder indicates that the received speech frame is erroneous. In the following when reference is made to an erroneous or an error-free speech frame it is referring to the detection of each individual erroneous frame that has been carried out for each received speech frame on the basis of the error correction coding and possibly by some other reasoning.

The identification of erroneous or error-free speech frames can in some cases fail and create a situation in which the erroneous frame is interpreted as an error-free one or an error-free frame as an erroneous erre. Occasionally, there is a situation in which the transmission error is not detected and the erroneous speech coding parameters are used for decoding the speech signal which is particularly difficult and results in incorrect decoding. Due to the restricted capacity or information bandwidth of a typical transmission channel not all parameters can be protected by error correction coding, thus not all transmission errors can be detected in the receiver.

FIG. 1 shows a schematic block diagram for a well-known receiver of a communication system for transmitting speech signals. A received digital information frame 100 is introduced into the channel decoder 101. The speech coding parameters 102 according to whatever speech coding method is used are received from the channel decoder, and for each frame an indication of the level or error 103 i.e. information about whether an error has been detected in the received frame that the channel decoding has been unable to correct, is also received from the channel decoder. The parameters of the speech coder are introduced further into block 104, where a processing of the coding parameters is carried out. The processing typically contains some system for removing a bad frame or replacing it. The processed coding parameters 105 are finally introduced into the speech decoder 106, which on the basis thereof synthesizes the speech signal 107.

FIG. 2 shows more precisely the processing block 104 for the coding parameters of FIG. 1. This block is designated by the reference numeral 200 in FIG. 2. The speech coding parameters 201 of each received frame received from the channel decoder 101 are coupled directly to the output 203 if the error indicator 202 also introduced from the channel decoder 101 into the processing block 200 indicates that no uncorrected transmission error has been detected in the parameters of the received frame, nor can a transmission error in the received frame be detected in the parameters of the speech coder. The detection of transmission errors directly from the speech coding parameters is carried out in block 206 contained in the processing block of the coding parameters.

In the classifying block 207 the received frame is classified either as erroneous or error-free on the basis of various error indicators. On the basis of the result of the classification the switch 208 is controlled so that the received parameters 201 are introduced directly into the output 203, the switch in position 2, if the speech frame has been classified as error-free. In the case of an error being detected in the speech frame, the switch turns to position 1. As a result of this the parameters received from the replacement, or erroneous frames in the replacement black of erroneous frames 204 are coupled to output 203. In replacement block 204 the parameters of the erroneous speech frame are replaced with the parameters of the last received error-free frame or on the basis of these parameters with new parameters extrapolated from them by some suitable method. FIG. 2 displays a delay block 205 which shows the dependency of the parameters of each of the frames to be replaced on the parameters used in the former frame during the replacement procedure.

When information is received that the received speech frame is erroneous it is not worth while to bring the erroneous speech coder parameters to the speech decoder, but it is advisable to replace the lost speech frame by some suitable means such as described earlier. One well-known simple method to replace a lost speech frame is to silence the output completely instead of using the received erroneous parameters. This way of proceeding is not very good or practical because it causes breaks which clearly impair the quality of the synthesized speech signal.

Another well-known method, which is a better way than silencing the speech signal decoding, is to use some or all of the parameters of the last-received good speech frame instead of the lost parameters. The efficiency of this replacement procedure is based on the fact that most of the sounds of the speech signal last substantially longer than the frame length 20 ms typically used in speech coding and, thus, the properties of a speech signal do not vary very quickly. This kind of a procedure is described, for example, in UK patent application GE1-2,238,933. At its best, a speech signal corresponding fairly well to a lost speech frame can be produced by a replacement procedure. However, a drawback is that it cannot be repeated many times, for example, when several subsequently lost frames are being replaced the speech signal will gradually begin to sound unnatural and machine like. The duration of speech sounds is typically some hundreds of milliseconds at the most, so it is not reasonable to continue with the replacement procedure longer than this. when replacing several subsequent erroneous frames it is worth while carrying out the replacing by processing the parameters of the speech coder so that the speech signal fades out during a certain finite time. Hereby no sound remains continuously ringing even in the case when a long sequence of solely erroneous speech frames is received.

FIG. 3 shows a flow chart showing a replacement procedure of erroneous frames well-known in the field, which can be used in the system according to FIG. 2. The state 0 in the chart illustrates a situation where a frame classified as error-free has been received and hence no replacement procedure is needed, and the speech coding parameters of the received frame are introduced as such into the speech decoder, the switch of FIG. 2 being in position 2. State 0 is entered every time the received frame has not been indicated as erroneous and all error-free frames are introduced into the speech decoder. When after an error-free frame the first erroneous frame is received, the replacement procedure 301 for erroneous frames is started, whereby the switch of FIG. 2 turns to position 1. In case of subsequent erroneous frames the states 2, 3, etc. are entered. During the replacement procedure 301 the parameters of the last error-free frame are used to replace the frame received in an erroneous form. The replacement procedure by means of the parameters of the last error-free frame is carried out for M-1 subsequent erroneous frames at the most, where M is a positive integer. After this the state M is reached, in which parameters silencing the output completely are introduced into the speech decoder. In the replacement procedure the parameters are typically processed so that they produce a more attenuated speech signal for each subsequent erroneous frame replaced i.e. the higher the state number reached in the flow chart of FIG. 3 the greater the attenuation.

In the replacement procedure, usually, only the first speech frame to be replaced (i.e. when in state 1) is directly replaced with the parameters of the error-free frame as such and at least from the second frame to be replaced i.e. frame 2 on, the parameters are processed so that the synthesized speech signal begins to attenuate. The attenuation of a speech signal to be synthesized can be carried out using linear predictive coding of LPC type (Linear Predictive Coding), for instance, by attenuating the strength of the excitation signal from frame to frame.

The operation of the system can be described as follows using the markings $r_{rec}$=parameter which is received from the channel decoder and which transmits the amplitude of the speech signal to be synthesized, $r_{dec}$=parameter which transmits the amplitude of the speech signal to be synthesized and which is fed into the speech decoder, $r_{dec,prev}$=parameter which transmits the amplitude of the speech signal to be synthesized and which has been fed into the speech decoder during the previous speech frame step=a constant attenuating the replacement procedure during subsequent erroneous frames

| | |
|---|---|
| STATE 0: | $r_{dec} = r_{rec}$ |
| STATE 1: | $r_{dec} = r_{dec,prev}$ |
| STATE 2, ..., STATE M-1 | $r_{dec} = r_{dec,prev} - $ step |
| STATE M: | silence output of speech decoder completely |

In known speech coding systems which use the above-described replacement procedures of erroneous frames, a replacement procedure is carried out independently of the quality of the transmission connection. Thus, the replacement procedure is started as strongly for relatively good channel conditions as for very bad channel conditions. Hereby, some subsequent good frames that have arrived during a bad transmission connection in portions containing mainly erroneous frames start a replacement procedure continuing over several frames. Thus, a major part of the speech synthesized by a speech decoder during a transmission connection of bad quality is speech produced solely by means of the replacement procedure. By carrying out a strong replacement procedure when a bad transmission connection is prevailing is; is endeavoured to artificially lengthen the duration of the speech signal, although so few error-free speech frames are received there is insufficient information to initiate, on the whole, the replacement procedure on reasonable grounds and so that lost speech frames could be replaced by means of it well enough. During a bad transmission connection when a strong replacement procedure is started based on a single frame indicated as error-free, machine like sounds which the human sense of hearing cannot at all interpret as speech are caused in the speech signal deteriorating its quality.

In known speech coding systems the error-free speech frames are introduced into the speech decoder independent of the condition of the transmission connection. During a transmission connection of bad quality it is, however, not sensible, as far as the quality of the speech is concerned, to bring the parameters of a frame indicated as error-free as such directly to the speech decoder. However, it is worth while to soften in some suitable way the transition from the replacement procedure or instigate a complete attenuation of the output of the speech decoder to the use of speech frame parameters. This is due to several factors. Firstly, the activation of the speech decoder after a long transmission connection can produce a sudden change in the speech signal which impairs the quality of the speech. Although the parameters of the speech signal were error-free the speech decoder has, because of the break, lost information relevant to the previous frames of the .speech and used in decoding later speech and will not start decoding of the speech signal from a correct internal state. The internal state is affected e.g. by the values of the state variables of filters contained in the speech decoder, which after a long replacement procedure phase are no longer correct. Secondly, during a bad transmission connection it is more likely than otherwise that the error correction coding has failed in the frame interpreted as error-free and has given a wrong indication of the level of error in the speech frame- the received frame identified as error-free can contain bad transmission errors.

SUMMARY OF THE INVENTION

According to a first aspect of the invention there is provided a method for processing speech frames in a receiver, comprising classifying a received speech frame as erroneous or error-free and placing an erroneous frame in one of several replacement states (state $D_1$, state $D_2$, ... state $D_M$) for replacing the erroneous frame with a frame corresponding to a previously received error-free speech frame wherein the quality of a transmission connection is determined by means of the erroneous/error-free classification such that the quality deteriorates as the number of erroneous speech frames increases;

the replacement of erroneous frames is depending on the quality of the transmission connection such that the duration and strength of the replacement is decreased while the quality deteriorates; and error-free frames are reduced in strength for a transmission connection of bad quality and in a transmission connection of good quality error-free frames are unattenuated.

According to a second aspect of the invention there is provided a method for processing speech frames for a receiver, comprising classifying a received speech frame as an error-free or erroneous speech frame;

defining a first state $D_1$ for replacing an erroneous speech frame with a speech frame corresponding to a previous error-free speech frame;

defining further first sequential states $D_2 \ldots D_M$ corresponding to subsequent occurrences of erroneous speech frames and for replacing said subsequent erroneous speech frames with said speech frame corresponding to a previous error-free speech frame having sequentially increasing attenuation corresponding to a particular state $D_2 \ldots D_M$; and defining a second sequence of states $U_o \ldots U_{M-1}$ respectively corresponding to an error-free frame being received during respective states $D_1 \ldots D_M$;

wherein a further occurrence of an error-free frame defines a state in a lower sequential position of said second sequence of states ($U_o \ldots U_{M-1}$) and an occurrence of an erroneous frame defines a corresponding first state ($D_1 \ldots D_M$).

According to a third aspect of the invention there is provided a digital communications receiver comprising classification means for classifying a received channel decoded speech frame as erroneous/error-free;

a replacement means for replacing erroneous frames with frames corresponding to previously received error-free speech frames;

coupling means, which in response to a control signal given by the classifying means couples either a replaced frame or an error-free speech frame to a speech decoder further comprising;

a frame processing means, for receiving speech frames, processing received frames and coupling processed frames into the connecting means;

a quality control means, responsive to said control signal for producing a signal indicative of the quality of a transmission connection, wherein the replacement means decreases the duration and strength of the replacement of erroneous frames while the quality of the transmission connection deteriorates compared with the replacement carried out during a good quality transmission connection; and the frame processing member processes the frames such that for a bad quality transmission connection the speech signal produced by the speech decoder is attenuated and for a good quality connection the frames are not processed by the frame processing means.

An advantage of the present invention is that speech quality can be improved.

BRIEF DESCRIPTION OF THE DRAWINGS

FIG. 6 shows an example illustrating the change of the states in the system operating in accordance with the invention.

DETAILED DESCRIPTION OF EMBODIMENTS OF THE INVENTION

Embodiments of the invention are now described by way of example only and with reference to the above-described drawings.

Figure 1:
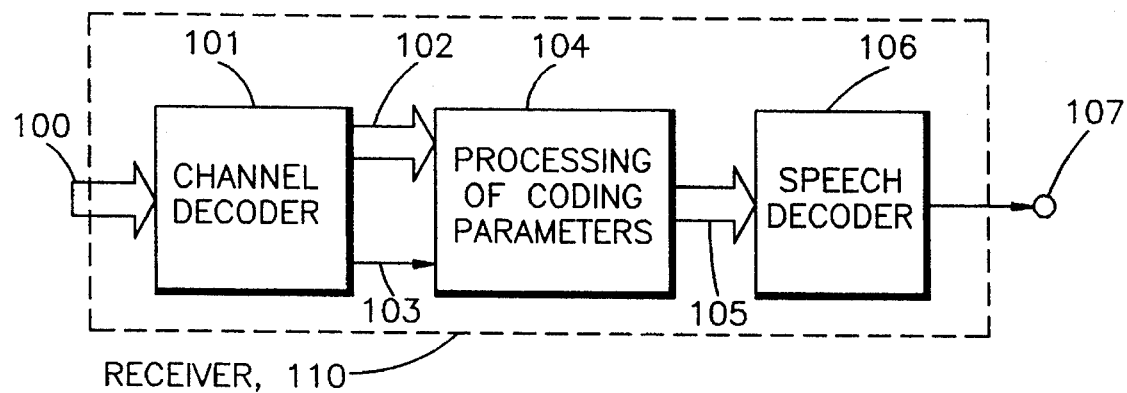
FIG. 1 shows a schematic block chart of principle of the receiver of a communications system.
Figure 2:
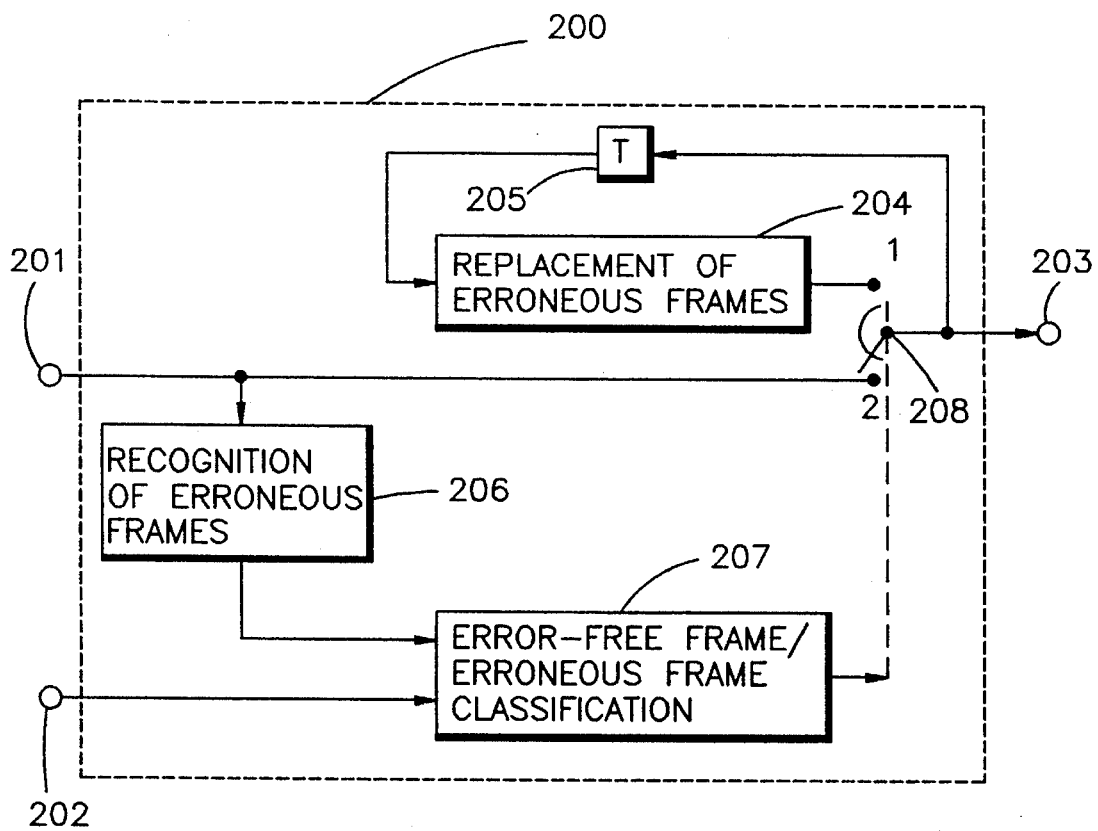
FIG. 2 shows a replacement procedure of erroneous frames according to a system known in the field.
Figure 4:
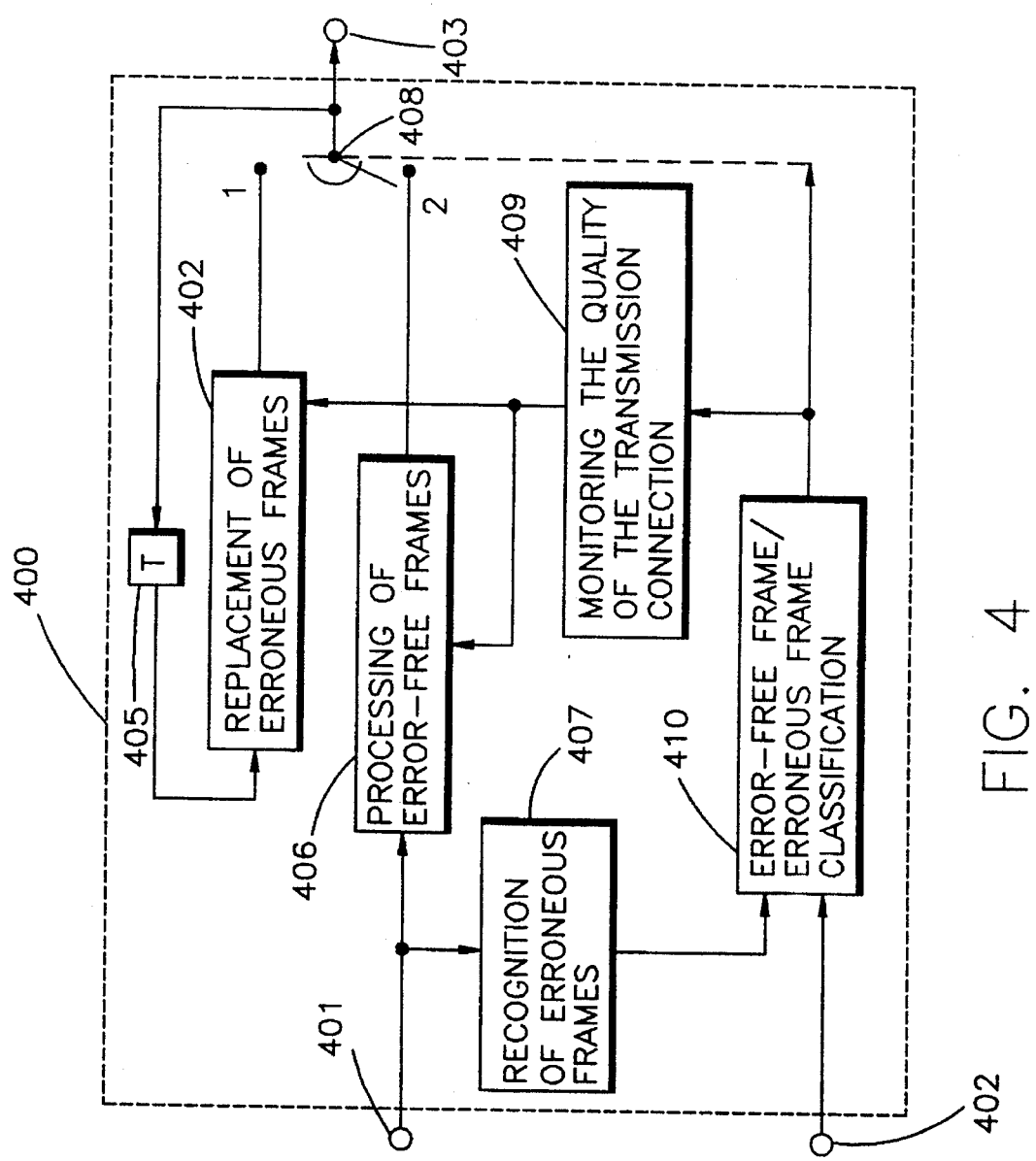
FIG. 4 shows a receiver according to the invention, in which both the replacement of erroneous frames and the processing of error-free frames are carried out dependent on the quality of the transmission connection.

The processing system 400 of speech coding parameters shown in FIG. 4 differs from the systems known in the field, for example from those shown in FIG. 2, in such a way that in the system of FIG. 4 the quality of the transmission connection is estimated in block 409 and the outcome is used to control the processing of the speech coding parameters-Both the replacement ortho erroneous frames 402 and the processing of the error-free frames carried out in block 406 are controlled on the basis of the quality of the transmission connection.

In the system either the parameters produced by the replacement procedure (switch 408 in position 1) or the parameters of the received frame indicated as error-free (switch in position 2) are introduced into the output. The quality of the transmission connection is determined on the basis of the individual error indications of the received frames in block 409. The indication of the errors is carded out in block 410 and it is based on the information 402 received from the channel decoding and possibly on frame errors detected by other means, e.g. errors identified directly from the speech coding parameters in block 407.

When the transmission connection has been determined in block 409 as bad and the frame received has been classified as erroneous, the parameters of the replacing frame are processed in the replacement block of erroneous frames 402 so that the decoded speech signal fades out quicker than in the case where the transmission connection is determined as good.

A strong replacement procedure is allowed when the transmission connection has been determined as good quality and erroneous frames have been received.

When the transmission connection has been determined as particularly bad and when frames classified as erroneous are received, replacement of erroneous frames by using parameters derived from the last error-free frame is not necessarily carried out at all, but the output of the speech decoder is attenuated completely for the first frame classified as erroneous.

When the received frames have been determined as error-free they are introduced into the output (switch 408 is in position 2) either as such or processed depending on the quality to which the transmission connection has been determined to belong to. The frames are attenuated in block 406, according to the estimation of the quality of the transmission connection carried out by the estimation block 409, by a greater amount the poorer the transmission connection has been when the frame indicated as error-free is received from the channel decoder.

Figure 5:
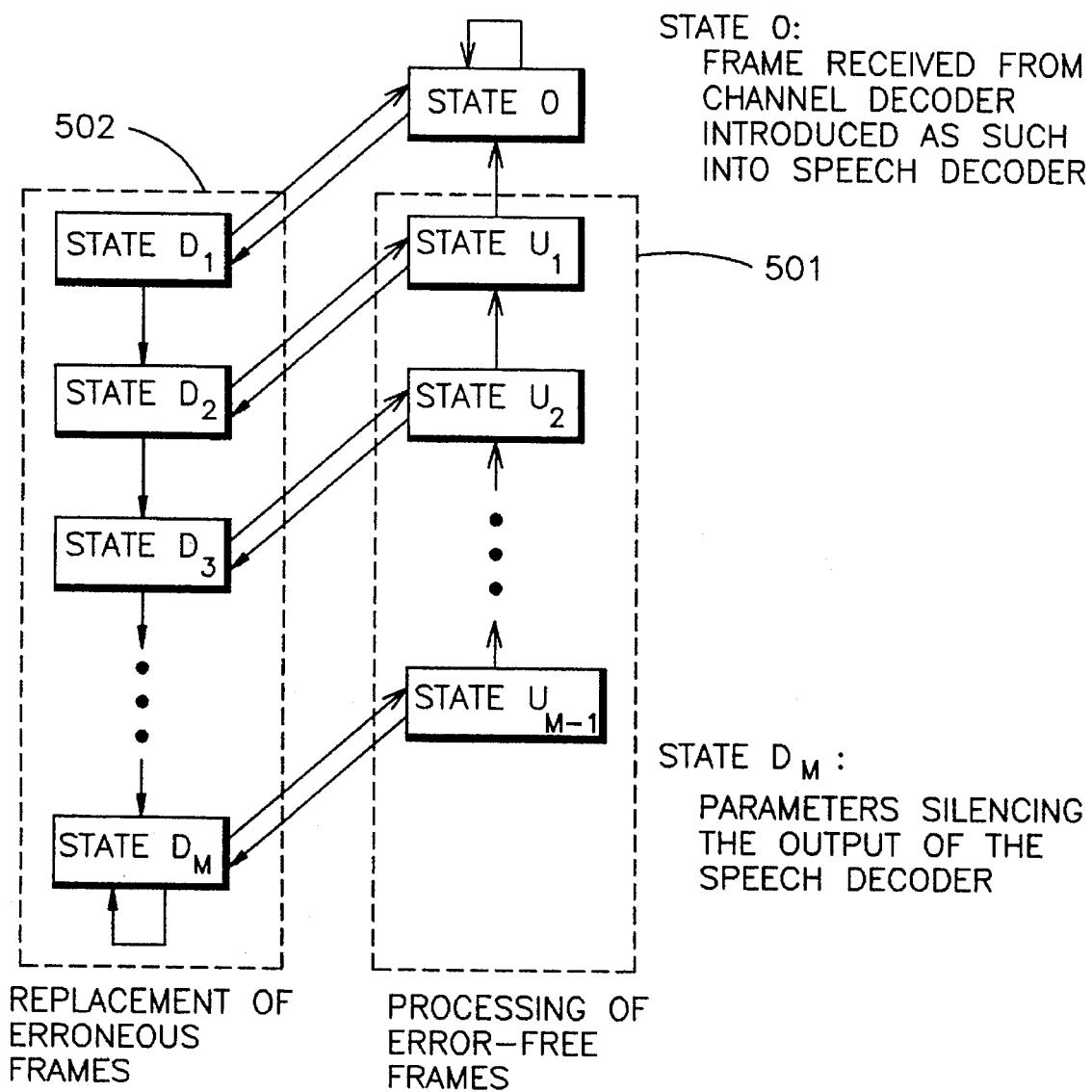
FIG. 5 shows a flow chart of the system according to the invention.

Only in the case when the quality of the transmission connection in block 409 has been determined according to the best possible one, are the coding parameters introduced directly into the output 403 for the synthesising of speech signal in the speech decoder. Otherwise, the speech coding parameters are processed so that the speech signal produced by them in the speech decoder is more greatly attenuated the poorer the transmission connection is in which the frame indicated as error-free is received. The transition from the break state, when the speech coder has been attenuated completely, to the use of the parameters of the received speech frame is softened in this way because the activation of the speech decoder after a long break of a transmission connection can produce a sudden change in the speech signal impairing the quality of the speech and, also because during a bad transmission connection it is more likely that in a frame interpretecy as error-free the error correction coding has failed and the frame indicated as error-free is in reality an erroneous one.

in FIG. 5 there is shown an embodiment of a flow chart realising a system in accordance with the invention. In the flow chart the system 501 used for the replacement of the erroneous frames and the system 502 used for processing the error-free frames have been separated as individual parts in the system in accordance with the invention a similar state structure 301 as in FIG. 3 can be used for replacing the erroneous frames, with the exception and surprising expedient that the replacement of bad frames can be started (dependent on the quality of the transmission connection:) from any state, even in the state where the output of the speech decoder is directly attenuated completely (state $D_M$). Correspondingly as in the known system shown in FIG. 3 only the first speech frame is directly replaced with the parameters of good frame, and from processing of the second frame, the replacement of parameters is such so that the synthesized speech signal is attenuated more greatly the greater the number of subsequent frames replaced. The replacement procedure continues by using the parameters of the last received error-free frame until the state $D_M$ is entered where the output of the speech decoder is attenuated completely.

The attenuation of error-free frames fore bad transmission connection is carried out in the processing of error-free frames 501 during the states $U_{m-1}, U_{m-2}, \ldots, U_1$ such that only when the quality of the transmission connection has improved sufficiently is state 0 entered i.e. the speech coding parameters 401 received from the channel decoder that have arrived at the processing block 400 of FIG. 4 are allowed to go directly to the output 403 to be introduced into the speech decoder. Only in state 0 i.e. in case of the case of the best transmission connection classification is the received frame taken directly to use in the speech decoder. In state $U_{m-1}$ processing is carried out for the speech coding parameters of the frame indicated as error-free which attenuates the signal to be decoded the most. The attenuation decreases towards state $U_1$. A strong attenuation is used when the channel is in the poorest classification state i.e. in the case where the error-free frame is received when the output of the speech decoder is completely attenuated (i.e. the system being in state $D_M$).

In the above-described embodiment the amplitude of both the replacement of the erroneous frames and the attenuation of the error-free frames depends on which level of the chart according to FIG. 5. This, for its part, is determined by the quality or the transmission connection i.e. how great a potdon of the preceding frames coupled to the receiver has been indicated as erroneous. In the embodiment above the state of the transmission connection is estimated with a state machine arrangement, in which the arrival of an erroneous or an error-free speech frame transfers the state of the system in different directions and which, in this way, determines from frame to frame the quality of the transmission connection on the basis of error indications of single frames. The quality determination of a transmission connection according to the invention can be performed on the basis of error indications of single frames also by other means than by a state system arrangement according to FIG. 5.

Figure 3:
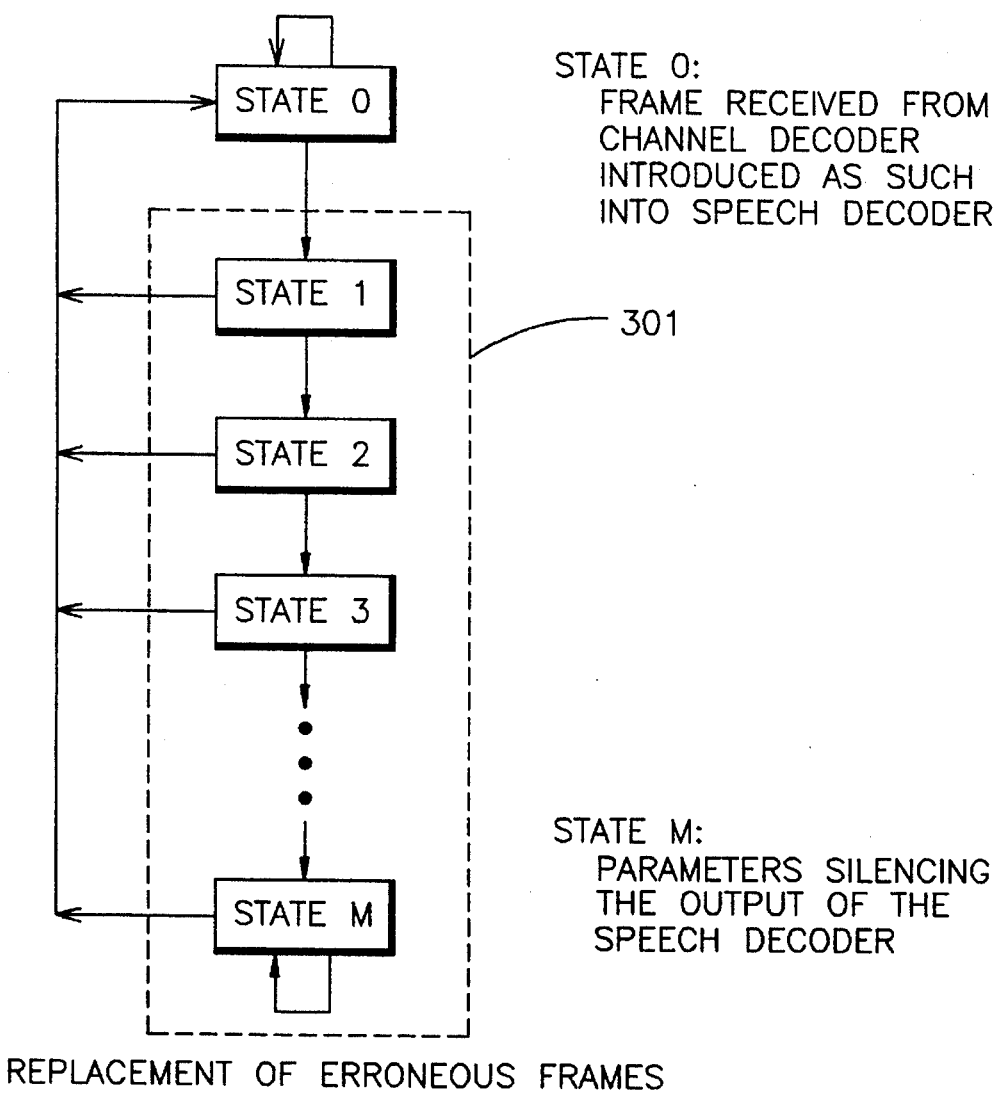
FIG. 3 shows a flow chart of a replacement procedure of erroneous frames known in the field.

In the system in accordance with the invention any known replacement procedure of erroneous frames can be used, for example the system presented in conjunction with FIG. 3, in which the value of the parameter transferring the strength of the excitation signal is decreased step by step. By using a greater step size step (STATE $D_i$), in which i=2 . . . , M–1, of decrease the poorer the transmission connection is the replacement procedure can be attenuated in the case of a bad transmission connection rapidly and thus a strong dependency is achieved in regard to the quality of the transmission connection and the strength of the replacement procedure step (STATE $D_i$) > step (STATE $D_{i+1}$), i=2, . . . , M–2). This can be realised, for example as follows:

| | |
|---|---|
| STATE $D_1$: | $r_{dec} = r_{dec,prev}$ |
| STATE $D_i$; i = 2, . . . , M-1 | $r_{dec} = r_{dec,prev}$ – dstep (STATE $D_i$) |
| STATE $D_M$: | attenuate the output of the speech decoder completely |

The reception of the error-free frames starts the processing 501 of the error-free frames, which is used except to control the strength of the replacement of the erroneous frames in the above-described manner, also to prevent a too big change in the speech signal when the transmission connection becomes activated. The poorer the transmission connection is when speech frames indicated as error-free are received, the more states of the processing of error-free frames 501 are passed before the speech coding parameters are introduced directly into the speech decoder i.e. the state 0 is reached and the softer the change to the use of received speech coding parameters becomes.

Several different methods can be used for the attenuation of the speech coding parameters in the states of the processing 501 of the error-free frames. For example, the rate of change of the speech coding parameter affecting the synthesised speech can be limited to the value ustep (STATE $U_i$) depending on the state of the system:

| | |
|---|---|
| STATE $U_i$; i = M-1, M-2, . . . , 1: | |
| if | $r_{dec} > r_{dec,prev} +$ ustep(STATE $U_i$) |
| then | $r_{dec} = r_{dec,prev} +$ ustep(STATE $U_i$); |
| otherwise $r_{dec} = r_{rec}$ | |

The parameter concerned affecting the strength can also be attenuated directly with the value mplier (STATE $U_i$) depending on the state:

| |
|---|
| STATE $U_i$; i = M-1, M-2, . . . , 1: |
| $r_{dec} = r_{rec}$ * mplier(STATE $U_i$) |

In state 0 the speech coding parameters are introduced as such into the speech decoder i.e.

STATE 0:$r_{dec}=r_{rec}$.

In FIG. 6 an example is given illustrating the change of the states in the operation of the system working on the basis of the quality of the transmission connection. In the case of the example the arrangement according to FIG. 5 has been used, in which there are 6 levels (M=6) in the processing of the erroneous frames and 5 levels in the processing of the error-free frames. In the left column subsequent frames have been indicated by consecutive numbers. In the following column the classification of each frame has been indicated so that the erroneous frames have been marked with B (Bad frame) and the error-free frames with g (good frame). In the figure the time order is from up to down so that below there are the indications related to the frames that have arrived last to the receiver. From the error indications one can see that the transmission connection deteriorates in this example as a function of time i.e. the number of frames indicated with B increase.

In the third column from left the progress of the processing of the speech frames is presented based on the error indications of the second column as reallead by the arrangement according to FIG. 5. The processing state of each frame is marked so that the letter possibly related to the state is presented before the number of the state. D3, for example, means that one is in the state STATE $D_3$ of the replacement procedure of erroneous frames. For the sake of comparison, the corresponding progress in the prior known system according to FIG. 3 has been marked in the figure, in the right hand column, i.e. the numbers of the passed states in the replacement of erroneous frames. In that case the operation transfers directly from the replacement state to transmit the parameters of the error-free frame (State 0) immediately when such a frame is received.

The differences between known systems and the present invention appear clearly from the two right hand columns. The column "Processing state according to the invention" shows clearly that the replacement procedure by using the parameters of the error-free frame is not carried out for a very long time when the channel becomes worse, For the bad frames beginning at frame 16 a full replacement procedure of the length of 5 frames is still carried out by using the parameters of the last error-free frame before the attenuation of the output of the speech decoder. The worse the transmission connection is the shorter is the duration of the replacement carried out for the erroneous frames. For the bad frames beginning at frame 24 only a replacement lasting only one frame is carried out before the output of the speech decoder is attenuated completely. When the transmission connection is further deteriorated the replacement procedure is dropped completely and state $D_6$ is reached, in which the output of the coder is fully silenced. The speech coding parameters received in the frame 30 indicated as error-free are introduced into the speech decoder and after that the replacement by using the parameters of the error-free frame is not started at all, and at the frame 31 the use of the parameters fully attenuating the output of the speech decoder is directly started.

Except that the replacement procedure is strong only in a fairly good transmission connection (in the upper portion of FIG. 6), also the transmission of error-free frames to the speech decoder takes place only in a good transmission connection (State 0). When the transmission connection is deteriorating when approaching the lower portion of the figure even the parameters of the speech coder received as error-free are introduced into the speech decoder so processed that a sudden opening of a transmission connection is prevented, in view of the foregoing description it will be evident to a person skilled in the art that various modifications may be made within the scope of the invention.

The scope of the present disclosure includes any novel feature or combination of features disclosed therein either explicitly or implicitly or any generalisation thereof irrespective of whether or not it relates to the claimed invention or milligates any or all of the problems addressed by the present invention, the applicant hereby gives notice that new claims may be formulated to such features during prosecution of this application or of any such further application derived therefrom.

What we claim is:

1. A method for processing speech frames in a receiver, comprising the steps of:

classifying a received speech frame as erroneous or error-free and placing an erroneous frame in one of several replacement states (state $D_1$, state $D_2$. . . state $D_M$) for replacing the erroneous frame with a frame corresponding to previously received error-free speech frames, wherein a quality of a transmission connection is determined by means of an erroneous/error free classification such that the quality deteriorates as a number of erroneous speech frame increases;

a replacement of erroneous frames is dependent on the quality of the transmission connection such that a duration and strength of the replacement is decreased while the quality deteriorates; and error-free frames are reduced in strength for a transmission connection of bad quality and in a transmission connection of good quality error-free frames are unattenuated.

2. The method according to claim 1, wherein an arrival of a speech frame indicated as erroneous moves the replacement state ($D_1$. . . $D_M$) in a direction of a poorest transmission connection quality measure ($D_M$), and an arrival of a speech frame indicated as error-free transfers the replacement state in a direction of a better quality transmission connection.

3. The method according to claim 1, wherein when the quality of transmission connection has been determined as poorest replacement frames are completely attenuated in the replacement state (state $D_M$).

4. The method according to claim 1, wherein in determining the quality of the transmission connection some other information is used in addition to the erroneous/error-free information of a single received frame.

5. The method according to claim 1, wherein only one of controlling of the replacement procedure of erroneous frames and controlling of the processing of error-free frames is carried out according to the quality of the transmission connection.

6. A digital communications receiver comprising:

classification means for classifying a received channel decoded speech frame as erroneous/error-free;

a replacement means for replacing erroneous frames with frames corresponding to previously received error-free speech frames;

coupling means, which in response to a control signal given by the classifying means couples either a replaced frame or an error-free speech frame to a speech decoder, said receiver further comprising;

a frame processing means, for receiving speech frames, processing received frames and coupling processed frames into the coupling means;

a quality control means, responsive to said control signal for producing a signal indicative of the quality of a transmission connection, wherein the replacement means decreases a duration and strength of the replacement of erroneous frames while the quality of the transmission connection deteriorates compared with the replacement carried out during a good quality transmission connection; and the frame processing means processes the frames such that for a bad quality transmission connection a speech signal produced by the speech decoder is attenuated and for a good quality connection the frames are not processed by the frame processing means.

7. The receiver according to claim 6, wherein the quality control means indicates a poorer transmission connection quality when a speech frame indicated as erroneous arrives at the receiver and indicates a better quality transmission connection when a speech frame indicated as error-free is received at the receiver.

8. The receiver according to claim 6, wherein the replacement means skips one or several replacement states when the quality of the transmission connection deteriorates quickly.

9. A method for processing speech frames for a receiver, comprising the steps of:

classifying a received speech frame as an error-free or erroneous speech frame;

defining a first state $D_1$ for replacing an erroneous speech frame with a speech frame corresponding to a previous error-free speech frame;

defining further first sequential states ($D_2$... $D_M$) corresponding to subsequent occurrences of erroneous speech frames and for replacing said subsequent erroneous speech frames with said speech frame corresponding to a previous error-free speech frame having sequentially increasing attenuation corresponding to a particular state ($D_2$... $D_M$); and defining a second sequence of states ($U_o$... $U_{M-1}$)respectively corresponding to an error-free frame be ing received during respect ive states ($D_1$... $D_M$);

wherein a further occurrence of an error-free frame defines a state in a lower sequential position of said second sequence of states ($U_o$... $U_{M-1}$) and an occurrence of an erroneous frame defines a corresponding first state ($D_1$... $D_M$).

10. The method according to claim 9, wherein the sequence of states ($U_o$... $U_{M-1}$) attenuate said error-free frames corresponding to a positional order of each state ($U_o$... $U_{M-1}$) and where $U_o$ has a zero attenuation.

11. The method according to claim 9, wherein each state in the second sequence of states ($U_o$... $U_{M-1}$) carries out zero attenuation on the error-free frames.

12. The method according to claim 9, wherein an occurrence of an erroneous frame subsequent to an occurrence of an error-free frame results in state $D_1$.

13. A method for processing speech parameters obtained in frames from a channel decoder together with an indication of whether a speech parameter frame is erroneous or error-free, comprising the steps of:

receiving a speech parameter frame;

classifying the received speech parameter frame as erroneous or error-free; and placing an erroneous speech parameter frame in one of several replacement states (state $D_1$, state $D_2$ ... state $D_M$) for replacing the erroneous speech parameter frame with a frame corresponding to a previously received error-free speech parameter frame;

wherein the quality of a transmission connection is determined by means of an erroneous/error-free classification of speech parameter frames such that the quality decreases as the number of received erroneous speech parameter frames increases and wherein the quality increases as the number of received error-free speech parameter frames increases;

wherein the replacement of erroneous speech parameter frames is dependent on the determined quality of the transmission connection such that an attenuation employed in the replacement is increased and the duration of the replacement is decreased when the quality decreases; and wherein a processing of error-free speech parameter frames is dependent on the determined quality of the transmission connection such that the processing is placed in one of several processing states (state $0$, state $U_1$, state $U_2$... state $U_{M-1}$), wherein speech parameter frames are unattenuated only when in state $0$.

14. The method according to claim 13, wherein an arrival of a speech frame indicated as erroneous moves the replacement state ($D_1$... $D_M$) in a direction of a poorest transmission connection quality measure ($D_M$), and an arrival of a speech frame indicated as error-free moves the replacement state in a direction of a better quality transmission connection.

15. The method according to claim 13, wherein when receiving an erroneous speech parameter frame at the lowest processing state $U_{M-1}$, no replacement of the erroneous frame is performed.

16. The method according to claim 15, and further comprising a step of completely attenuating an output of a speech decoder.

17. A method for operating a digital communications receiver of a type that includes a channel decoder for providing channel decoded speech frames to a speech decoder, comprising the steps of:

classifying a received channel decoded speech frame as one of an erroneous status and an error-free status;

maintaining an indication of the status of a plurality of previously received channel decoded speech frames, and adjusting on a received frame by received frame basis the indication between a highest level that is indicative of a plurality of consecutively received channel decoded speech frames being classified with error-free status, and a lowest level indicative of a plurality of consecutively received channel decoded speech frames being classified with erroneous status;

for each received channel decoded speech frame, and in accordance with a current level of the maintained indication, performing the steps of:

for the lowest level of the maintained indication, disabling an output of the speech decoder;

for the highest level of the maintained indication, providing the received channel decoded speech frame to the speech decoder;

for an intermediate level between the highest level and the lowest level, and for a received channel decoded speech frame that is classified as being in an erroneous status, replacing the received channel decoded speech frame with a replacement frame corresponding to a previously received error-free channel decoded speech frame, the replacement frame being attenuated as a function of the current level before providing the replacement frame to the speech decoder; and for an intermediate level between the highest level and the lowest level, and for a received channel decoded speech frame that is classified as being in an error-free status, attenuating the received channel decoded speech frame as a function of the current level before providing the received channel decoded speech frame to the speech decoder.

* * * * *